United States Patent
Kyogoku et al.

(10) Patent No.: US 10,600,863 B2
(45) Date of Patent: *Mar. 24, 2020

(54) SEMICONDUCTOR DEVICE AND METHOD FOR MANUFACTURING THE SAME

(71) Applicant: Kabushiki Kaisha Toshiba, Minato-ku (JP)

(72) Inventors: Shinya Kyogoku, Nagareyama (JP); Ryosuke Iijima, Setagaya (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/157,191

(22) Filed: Oct. 11, 2018

(65) Prior Publication Data

US 2019/0043942 A1 Feb. 7, 2019

Related U.S. Application Data

(63) Continuation of application No. 15/690,481, filed on Aug. 30, 2017, now Pat. No. 10,243,037.

(30) Foreign Application Priority Data

Oct. 31, 2016 (JP) ................ 2016-212712

(51) Int. Cl.
*H01L 27/082* (2006.01)
*H01L 29/06* (2006.01)
(Continued)

(52) U.S. Cl.
CPC ........ *H01L 29/063* (2013.01); *H01L 21/0465* (2013.01); *H01L 29/0878* (2013.01);
(Continued)

(58) Field of Classification Search
CPC ............. H01L 29/1095; H01L 29/7813; H01L 29/1608; H01L 29/7395; H01L 29/7802; H01L 29/7393; H01L 2924/13055
See application file for complete search history.

(56) References Cited

U.S. PATENT DOCUMENTS 7,825,449 B2 11/2010 Suzuki et al.
8,022,414 B2 9/2011 Suzuki et al.
(Continued)

FOREIGN PATENT DOCUMENTS

JP 2005-056912 A 3/2005
JP 2008-235546 10/2008
(Continued)

OTHER PUBLICATIONS

Hidefumi Takaya, et al., "A 4H—SiC Trench MOSFET with Thick Bottom Oxide for Improving Characteristics," Proceedings of the 25th International Symposium on Power Semiconductor Devices & ICs, pp. 43-46.

*Primary Examiner* — Hsien Ming Lee
(74) *Attorney, Agent, or Firm* — Oblon, McClelland, Maier & Neustadt, L.L.P.

(57) ABSTRACT

According to one embodiment, a semiconductor device includes first to fourth semiconductor regions, a first electrode, and a first insulating film. The first semiconductor region includes a first partial region and a second partial region. The second semiconductor region is separated from the first partial region. The third semiconductor region is provided between the first partial region and the second semiconductor region. The third semiconductor region includes a third partial region and a fourth partial region. The first electrode is separated from the second partial region and is separated from the second semiconductor region and the third semiconductor region. The first insulating film includes a first insulating region and a second insulating region. The (Continued)

fourth semiconductor region includes a first portion. The first portion is provided between the fourth partial region and at least a portion of the first insulating film.

18 Claims, 11 Drawing Sheets

(51) Int. Cl.
    *H01L 21/04*         (2006.01)
    *H01L 29/10*         (2006.01)
    *H01L 29/66*         (2006.01)
    *H01L 29/78*         (2006.01)
    *H01L 29/423*       (2006.01)
    *H01L 29/739*       (2006.01)
    *H01L 29/08*         (2006.01)
    *H01L 29/16*         (2006.01)

(52) U.S. Cl.
    CPC .... *H01L 29/1095* (2013.01); *H01L 29/42368* (2013.01); *H01L 29/66068* (2013.01); *H01L 29/66734* (2013.01); *H01L 29/7397* (2013.01); *H01L 29/7813* (2013.01); *H01L 29/1608* (2013.01)

(56) References Cited

U.S. PATENT DOCUMENTS

| | | | |
|---|---|---|---|
| 9,029,871 | B2 | 5/2015 | Soeno et al. |
| 2008/0014702 | A1 | 1/2008 | Kumar |
| 2009/0114969 | A1 | 5/2009 | Suzuki et al. |
| 2012/0319136 | A1 | 12/2012 | Noborio et al. |
| 2016/0149029 | A1 | 5/2016 | Takaya |

FOREIGN PATENT DOCUMENTS

| | | |
|---|---|---|
| JP | 2009-117593 | 5/2009 |
| JP | 2011-216783 A | 10/2011 |
| JP | 4798119 | 10/2011 |
| JP | 2012-169386 | 9/2012 |
| JP | 5547347 | 7/2014 |
| JP | 2016-100466 A | 5/2016 |
| JP | 6032337 B1 | 11/2016 |

SEMICONDUCTOR DEVICE AND METHOD FOR MANUFACTURING THE SAME

CROSS-REFERENCE TO RELATED APPLICATIONS

This application is a continuation of U.S. application Ser. No. 15/690,481, filed Aug. 30, 2017, now U.S. Pat. No. 10,243,037, which is based upon and claims the benefit of priority from Japanese Patent Application No. 2016-212712, filed on Oct. 31, 2016; the entire contents all of which are incorporated herein by reference.

FIELD

Embodiments described herein relate generally to a semiconductor device and a method for manufacturing the same.

BACKGROUND

It is desirable to reduce the on-resistance of a semiconductor device.

DETAILED DESCRIPTION

Figure 1A:
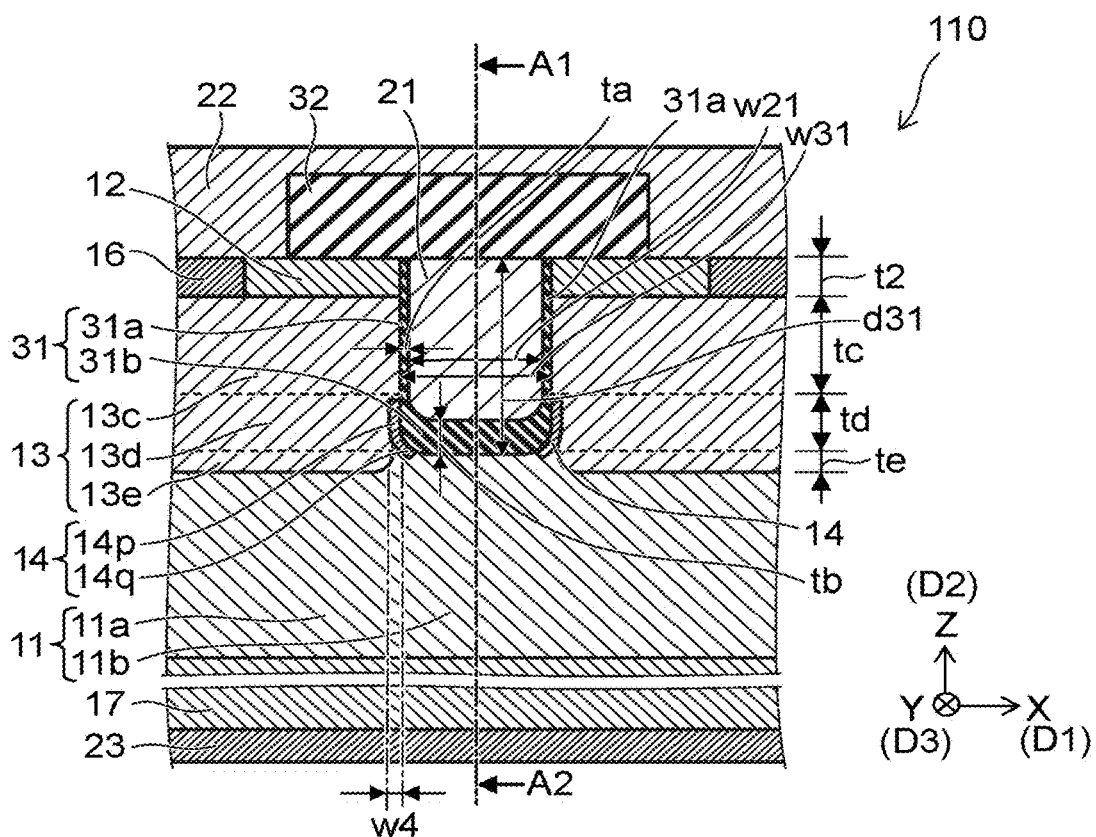
FIG. 1A and FIG. 1B are schematic views illustrating a semiconductor device according to a first embodiment.

According to one embodiment, a semiconductor device includes first to fourth semiconductor regions, a first electrode, and a first insulating film. The first semiconductor region includes a first partial region and a second partial region and is of a first conductivity type. The second semiconductor region is separated from the first partial region in a second direction crossing a first direction. The second semiconductor region is of the first conductivity type. The first direction is from the first partial region toward the second partial region. The third semiconductor region is provided between the first partial region and the second semiconductor region. The third semiconductor region is of a second conductivity type and includes a third partial region and a fourth partial region. The fourth partial region is positioned between the first partial region and the third partial region. The first electrode is separated from the second partial region in the second direction and is separated from the second semiconductor region and the third semiconductor region in the first direction. The first insulating film includes a first insulating region and a second insulating region. The first insulating region is provided between the second semiconductor region and the first electrode in the first direction and between the third semiconductor region and the first electrode in the first direction. A portion of the first insulating region contacts the third partial region. The second insulating region is provided between the second partial region and the first electrode in the second direction. The fourth semiconductor region includes a first portion and is of the first conductivity type. The first portion is provided between the fourth partial region and at least a portion of the first insulating film in the first direction. A first impurity concentration of the first conductivity type in the fourth semiconductor region is higher than a second impurity concentration of the first conductivity type in the first partial region.

According to another embodiment, a method for manufacturing a semiconductor device is disclosed. The method can include forming a trench in a stacked body. The stacked body includes a first semiconductor film of a first conductivity type, a third semiconductor film of a second conductivity type, and a second semiconductor film of the first conductivity type. The first semiconductor film is provided on a substrate. The third semiconductor film is provided on the first semiconductor film. The second semiconductor film is provided on the third semiconductor film. The trench is formed from the second semiconductor film. The method can include introducing an impurity of the first conductivity type into a lower portion of a side surface of the third semiconductor film exposed at a side wall of the trench. A concentration of the impurity of the first conductivity type in the lower portion is higher than a concentration of an impurity of the second conductivity type in the lower portion. In addition, the method can include forming a first insulating film on a surface of the trench after the introducing of the impurity into the lower portion, and forming a first electrode by introducing a conductive material into a remaining space in the trench after the forming of the first insulating film.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

Figure 1B:
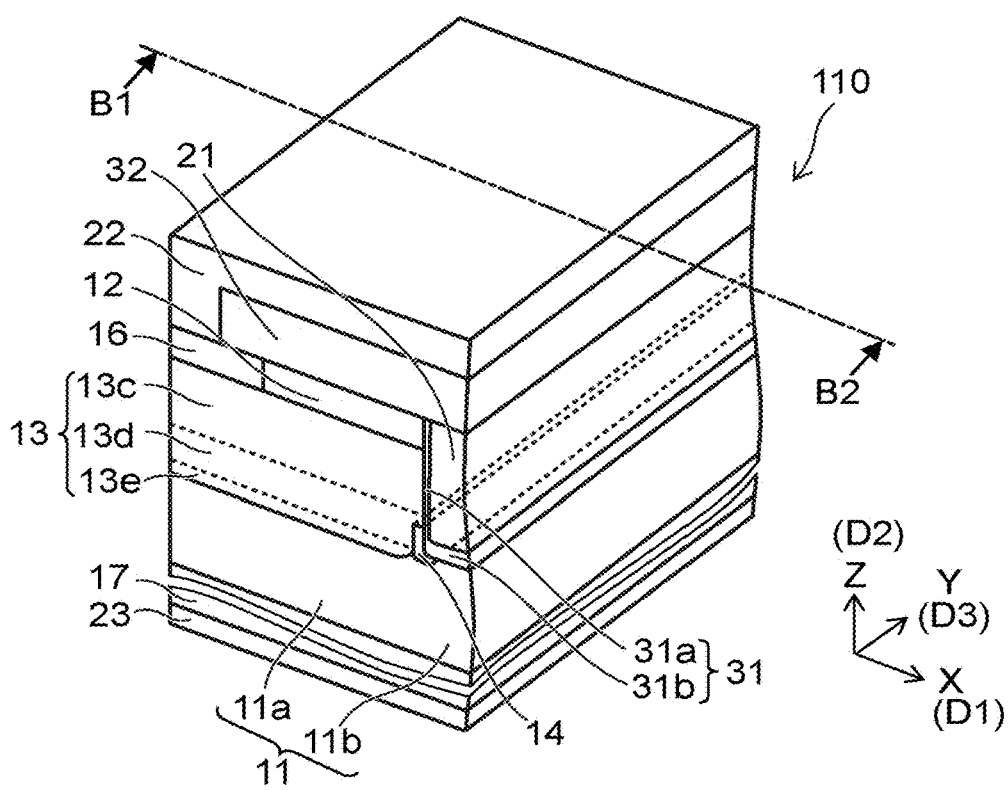

FIG. 1A and FIG. 1B are schematic views illustrating a semiconductor device according to a first embodiment.

FIG. 1A is a cross-sectional view corresponding to a cross section along line B1-B2 shown in FIG. 1B. FIG. 1B is a perspective view when cut along line A1-A2 of FIG. 1A.

As shown in FIG. 1A and FIG. 1B, the semiconductor device 110 according to the embodiment includes first to fourth semiconductor regions 11 to 14, a first electrode 21, and a first insulating film 31.

The first semiconductor region 11 includes a first partial region 11a and a second partial region 11b. The first semiconductor region 11 is of a first conductivity type.

The direction from the first partial region 11a toward the second partial region 11b is taken as a first direction D1.

The first direction D1 is taken as an X-axis direction. One direction perpendicular to the X-axis direction is taken as a Z-axis direction. A direction perpendicular to the X-axis direction and the Z-axis direction is taken as a Y-axis direction.

A second semiconductor region 12 is separated from the first partial region 11a in a second direction D2. The second direction D2 crosses the first direction D1. For example, the second direction D2 is, for example, the Z-axis direction.

The second direction D2 is the stacking direction of the first partial region 11a and the second semiconductor region 12. The stacking direction may be taken as the Z-axis direction; and a direction crossing the Z-axis direction may be taken as the first direction D1.

The second semiconductor region 12 is of the first conductivity type.

A third semiconductor region 13 is provided between the first partial region 11a and the second semiconductor region 12. The third semiconductor region 13 is of a second conductivity type.

For example, the first conductivity type is of an n-type; and the second conductivity type is of a p-type. In the embodiments, the first conductivity type may be the p-type; and the second conductivity type may be the n-type. In the description hereinbelow, the first conductivity type is taken to be the n-type; and the second conductivity type is taken to be the p-type.

The third semiconductor region 13 includes a third partial region 13c and a fourth partial region 13d. In the example, the third semiconductor region 13 further includes a fifth partial region 13e.

The fourth partial region 13d is positioned between the first partial region 11a and the third partial region 13c in the second direction D2. The fifth partial region 13e is provided between the fourth partial region 13d and the first partial region 11a in the second direction D2.

For example, the third semiconductor region 13 is provided on the first partial region 11a of the first semiconductor region 11; and the second semiconductor region 12 is provided on the third semiconductor region 13. The fifth partial region 13e of the third semiconductor region 13 is provided on the first partial region 11a. The fourth partial region 13d is provided on the fifth partial region 13e. The third partial region 13c is provided on the fourth partial region 13d.

For example, the impurity concentration of the second conductivity type (e.g., the p-type) in the third partial region 13c is higher than the impurity concentration of the second conductivity type in the fourth partial region 13d. For example, the impurity concentration of the second conductivity type in the fourth partial region 13d is higher than the impurity concentration of the second conductivity type in the fifth partial region 13e. For example, the impurity concentration of the second conductivity type (e.g., the p-type) increases upward.

The first electrode 21 is separated from the second partial region 11b in the second direction D2 (e.g., the Z-axis direction). The first electrode 21 is separated from the second semiconductor region 12 and the third semiconductor region 13 in the first direction D1 (e.g., the X-axis direction).

As described below, the first electrode 21 is used as a gate electrode. The second partial region 11b of the first semiconductor region 11 is a region positioned under the gate electrode.

The first insulating film 31 includes a first insulating region 31a and a second insulating region 31b. The first insulating region 31a is provided between the second semiconductor region 12 and the first electrode 21 in the first direction D1 (e.g., the X-axis direction) and between the third semiconductor region 13 and the first electrode 21 in the first direction. A portion of the first insulating region 31a contacts the third partial region 13c.

The second insulating region 31b is provided between the second partial region 11b and the first electrode 21 in the second direction D2 (e.g., the Z-axis direction).

The first insulating region 31a corresponds to the side portion of the first insulating film 31. The second insulating region 31b corresponds to the bottom portion of the first insulating film 31.

The fourth semiconductor region 14 includes a first portion 14p. As described below, the fourth semiconductor region 14 may further include a second portion 14q. The fourth semiconductor region 14 is of the first conductivity type (e.g., the n-type).

The first portion 14p is provided between the fourth partial region 13d and at least a portion of the first insulating film 31 in the first direction D1 (e.g., the X-axis direction).

For example, at least a portion of the first portion 14p is positioned between the fourth partial region 13d and the second insulating region 31b (the bottom portion) in the first direction D1 (e.g., the X-axis direction). For example, a portion of the first portion 14p may be positioned between the first insulating region 31a (the side portion) and the fourth partial region 13d in the first direction D1.

In the example, the semiconductor device 110 further includes a sixth semiconductor region 16, a seventh semiconductor region 17, a second electrode 22, a third electrode 23, and a second insulating film 32. A fifth semiconductor region 15 described below may be further provided.

The second electrode 22 is electrically connected to the second semiconductor region 12. The second insulating film 32 is provided between the first electrode 21 and a portion of the second electrode 22. The second insulating film 32 electrically insulates between the first electrode 21 and the second electrode 22.

The sixth semiconductor region 16 is electrically connected to the second electrode 22. The sixth semiconductor region 16 is of the second conductivity type (e.g., the p-type). The second semiconductor region 12 is provided between the sixth semiconductor region 16 and a portion of the first insulating film 31 in the first direction D1 (e.g., the X-axis direction). A portion of the third semiconductor region 13 is provided between the sixth semiconductor region 16 and the first semiconductor region 11 in the second direction D2 (e.g., the Z-axis direction).

The third electrode 23 is electrically connected to the first semiconductor region 11. The first semiconductor region 11 is provided between the third electrode 23 and the third semiconductor region 13 and between the third electrode 23 and the first insulating film 31.

The seventh semiconductor region 17 is provided between the third electrode 23 and the first semiconductor region 11. The seventh semiconductor region 17 is of the first conductivity type (e.g., the n-type). For example, the seventh semiconductor region 17 is a semiconductor substrate.

For example, in the embodiment, the first to fourth semiconductor regions 11 to 14 include, for example, silicon carbide (SiC). The sixth semiconductor region 16 and the seventh semiconductor region 17 also may include silicon carbide.

The impurity of the first conductivity type (e.g., the n-type) is, for example, a Group III element. The impurity of the first conductivity type includes, for example, at least one selected from the group consisting of Al and B. The impurity of the second conductivity type (e.g., the p-type) is, for example, a Group V element. The impurity of the second conductivity type includes, for example, at least one selected from the group consisting of N, P, and As.

The first semiconductor region 11 functions as, for example, an n-type drift layer. The second semiconductor region 12 functions as, for example, an n-type source region. The third semiconductor region 13 functions as, for example, a p-type base region. The first electrode 21 functions as, for example, a gate electrode. The first insulating film 31 functions as, for example, a gate insulating film. The second electrode 22 functions as, for example, a source electrode. The third electrode 23 functions as, for example, a drain electrode. The second insulating film 32 functions as, for example, an inter-layer insulating film.

As shown in FIG. 1B, the first electrode 21 extends along the second direction D2 and a third direction D3. The third direction D3 crosses the first direction D1 and the second direction D2. The third direction D3 is, for example, the Y-axis direction. The first electrode 21 is, for example, a gate electrode having a trench configuration. For example, a stacked body that includes semiconductor regions is provided on the seventh semiconductor region 17 (e.g., a semiconductor substrate); and a trench is formed in the stacked body. The first insulating film 31 is formed on the inner wall inside the trench. Then, the first electrode 21 is formed by filling a conductive material into the remaining space of the trench. The semiconductor device 110 is, for example, a MOSFET (metal-oxide-semiconductor field-effect transistor) SiC transistor including a gate electrode having a trench configuration.

As shown in FIG. 1B, the fourth semiconductor region 14 extends along the first electrode 21. The fourth semiconductor region 14 extends along the third direction D3.

In the embodiment, a first impurity concentration of the first conductivity type (e.g., the n-type) in the fourth semiconductor region 14 is higher than a second impurity concentration of the first conductivity type in the first partial region 11a.

Thus, in the semiconductor device 110 according to the embodiment, the fourth semiconductor region 14 in which the impurity concentration of the first conductivity type is high is provided between a portion of the third semiconductor region 13 and a portion of the first insulating film 31. It was found that a semiconductor device can be provided in which the on-resistance can be reduced thereby.

In the semiconductor device 110, the fourth semiconductor region 14 is used as another portion of the current path. It is considered that when a gate bias is applied, for example, a region having a high carrier density (e.g., an accumulation channel) is induced locally in the portion of the fourth semiconductor region 14 at the vicinity of the first insulating film 31. The region of the accumulation channel is narrow. Therefore, a low on-resistance is obtained even in the case where the fourth semiconductor region 14 is thin (the length in the X-axis direction is short).

The thickness (the length in the X-axis direction) of the first portion 14p of the fourth semiconductor region 14 is thin. For example, a thickness w4 along the first direction D1 of the first portion 14p (referring to FIG. 1A) is not less than 0.015 µm and not more than 0.45 µm. It is easy to reduce the cell pitch because the thickness w4 is thin. An example of the relationship between the thickness w4 and the characteristics is described below.

For example, in a first reference example having a double trench structure, a trench is provided to relax the electric field at the gate insulating film. However, it is difficult to reduce the cell pitch due to the trench for relaxing the electric field. Conversely, in the embodiment, it is easy to reduce the cell pitch. Thereby, an even lower on-resistance is obtained.

An example of simulation results of the characteristics of the semiconductor device 110 will now be described.

The following model is used in the simulation. The thickness in the Z-axis direction of the first semiconductor region 11 is 9 µm. The n-type impurity concentration of the first semiconductor region 11 is $8 \times 10^{15}/cm^3$. The thickness in the Z-axis direction of the second semiconductor region 12 is 0.15 µm. The n-type impurity concentration of the second semiconductor region 12 is $1 \times 10^{20}/cm^3$. The thickness in the Z-axis direction of the third partial region 13c is 0.35 µm. The p-type impurity concentration of the third partial region 13c is $8 \times 10^{17}/cm^3$. The thickness in the Z-axis direction of the fourth partial region 13d is 0.3 µm. The p-type impurity concentration of the fourth partial region 13d is $5 \times 10^{17}/cm^3$. The thickness in the Z-axis direction of the fifth partial region 13e is 0.15 µm. The p-type impurity concentration of the fifth partial region 13e is $5 \times 10^{16}/cm^3$. The thickness in the Z-axis direction of the fourth semiconductor region 14 is 0.35 µm. The thickness (the thickness w4) in the X-axis direction of the fourth semiconductor region 14 is 0.05 µm. The n-type impurity concentration of the fourth semiconductor region 14 is $4 \times 10^{17}/cm^3$. The thickness (a length ta shown in FIG. 1A) of the first insulating region 31a is 80 nm. The thickness (a length tb shown in FIG. 1A) of the second insulating region 31b is 250 nm. An example of the simulation results will now be described for the characteristics when 25 V is applied to the first electrode 21, 0 V is applied to the second electrode 22, and 0.3 V is applied to the third electrode 23 (when ON).

Figure 2:
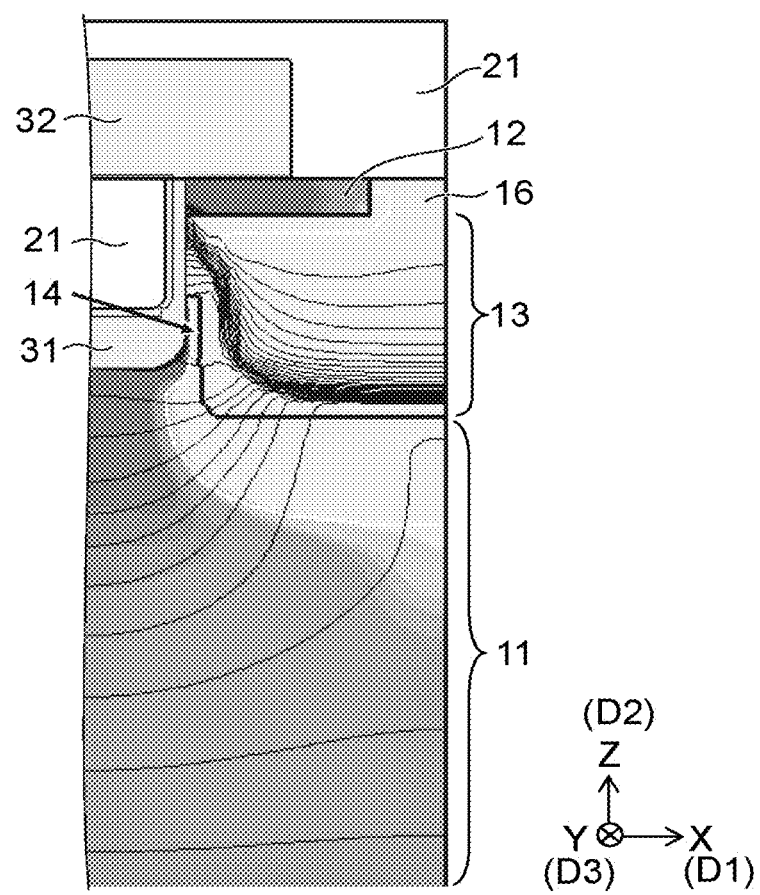
FIG. 2 is a schematic view illustrating the characteristics of the semiconductor device according to the embodiment.

FIG. 2 is a schematic view illustrating the characteristics of the semiconductor device according to the embodiment.

FIG. 2 corresponds to a cross section when the semiconductor device 110 is cut by the YZ plane. The position of the cutting includes the position of the center in the X-axis direction of the first electrode 21. In FIG. 2, the curved contour lines correspond to the contour lines of the quasi-Fermi potential of the electrons. In FIG. 2, the shade of the image corresponds to the current density. The current density in the region where the shade is dark is higher than the current density in the region where the shade is light.

As shown in FIG. 2, the current density is locally high at the vicinity of the interface between the first insulating film 31 and the lower portion of the second semiconductor region 12, the interface between the fourth semiconductor region 14 and the first insulating film 31, and the vicinity of the interface between the first insulating film 31 and the upper portion of the first semiconductor region 11. In the current path between the second semiconductor region 12 and the first semiconductor region 11, the current flows locally in the interface portion of the fourth semiconductor region 14 with the first insulating film 31.

The resistance (the on-resistance) of the current path is low. The characteristic on-resistance (RonA) is, for example, about 1.4 mΩ·cm$^2$. The characteristic on-resistance is the product of the on-resistance (Ron) and the surface area (A) of the channel formation region. Thus, the low on-resistance (or the characteristic on-resistance) is obtained due to the fourth semiconductor region 14 according to the embodiment.

On the other hand, the maximum electric field applied to the first insulating film 31 is determined for a configuration of the simulation conditions. For example, the maximum electric field is 3 MV/cm or less when the gate-source voltage is set to 0 V and the drain-source voltage is set to 1200 V. The breakdown voltage of the first insulating film 31 is sufficiently higher than this value. For example, good long-term reliability is obtained. As described below, the voltage at which avalanche breakdown occurs exceeds 1600 V.

Thus, in the embodiment, the maximum electric field that is applied to the first insulating film 31 is suppressed; and the on-resistance can be small while maintaining a high voltage at which avalanche breakdown occurs.

On the other hand, in a second reference example in which the fourth semiconductor region 14 such as that recited above is not provided, a configuration may be considered in which the maximum electric field applied to the first insulating film 31 is set to 3 MV/cm or less, and the voltage at which avalanche breakdown occurs exceeds 1600 V. In such a case, the impurity concentration of the region under the trench is set to be sufficiently high for electric field relaxation. For example, the n-type impurity concentration of this region is higher than the impurity concentration of the p-type region (the third semiconductor region 13) positioned at the upper portion and exceeds, for example, 1×10$^{18}$/cm$^3$. However, in the configuration of the second reference example, the on-resistance (the JFET resistance component) is large.

Thus, in the embodiment, the maximum electric field is suppressed; and a low on-resistance is obtained while suppressing the avalanche breakdown.

For example, a low on-resistance is obtained even in the case where the thickness w4 (the width) along the first direction D1 of the first portion 14p of the fourth semiconductor region 14 is set to be thin (narrow). Because the thickness w4 (the width) is thin, for example, the curvature of the equipotential lines at the trench bottom is suppressed. For example, the concentration of the electric field is relaxed. Thereby, in the embodiment, it is considered that the high breakdown voltage of the first insulating film 31 is obtained. For example, it is considered that a semiconductor device having a high breakdown voltage is obtained.

Thus, according to the embodiment, a low on-resistance is obtained.

Figure 3A:
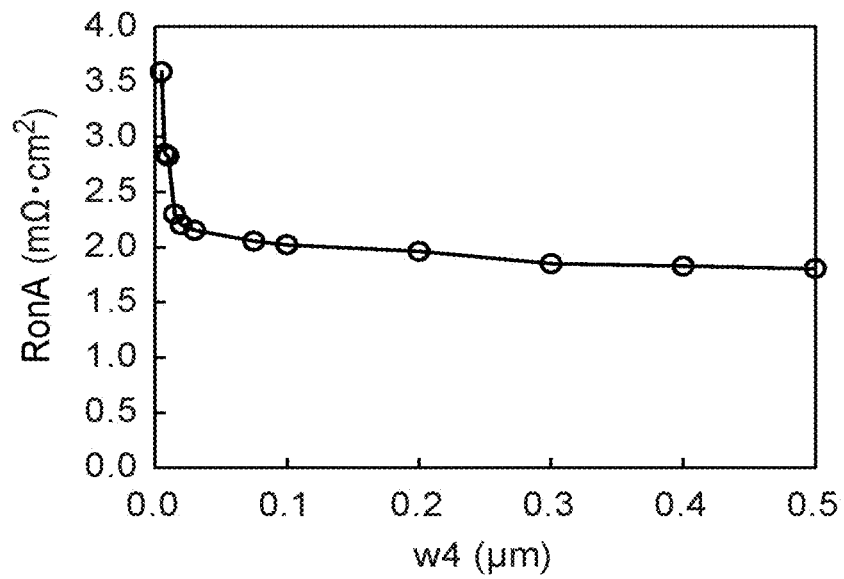
FIG. 3A and FIG. 3B are graphs illustrating characteristics of the semiconductor device.
Figure 3B:
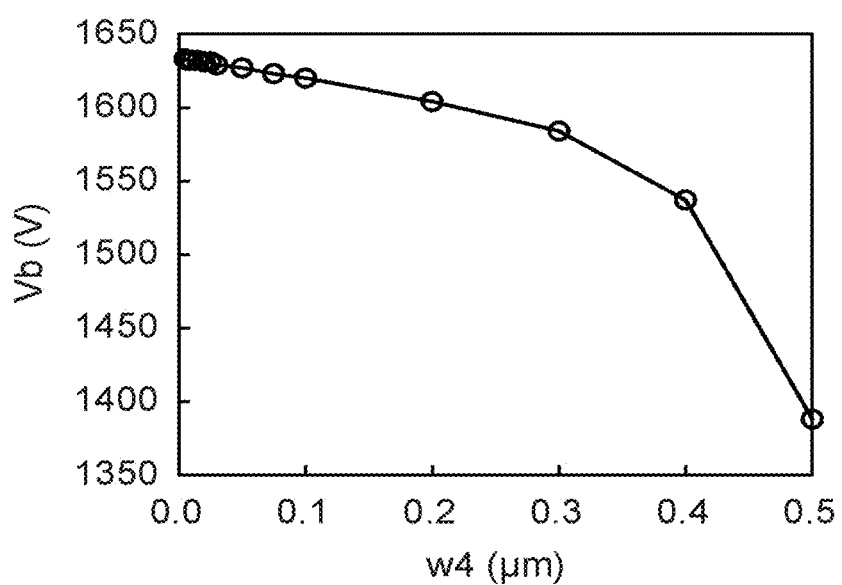

FIG. 3A and FIG. 3B are graphs illustrating characteristics of the semiconductor device.

These figures illustrate the relationships between the characteristics of the semiconductor device and the thickness w4 (the width) along the first direction D1 of the first portion 14p of the fourth semiconductor region 14. In these figures, the horizontal axis is the thickness w4. The vertical axis of FIG. 3A is a characteristic on-resistance RonA (mΩ·cm$^2$). The vertical axis of FIG. 3B is a breakdown voltage Vb (V). The breakdown voltage Vb (V) corresponds to, for example, the voltage at which avalanche breakdown occurs. In FIG. 3A and FIG. 3B, other than the thickness w4, the conditions of the simulation are the same as the conditions described in reference to FIG. 2. A small characteristic on-resistance RonA corresponds to a small (low) on-resistance Ron.

As shown in FIG. 3A, the characteristic on-resistance RonA becomes large when the thickness w4 is excessively small. For example, the characteristic on-resistance RonA increases markedly when the thickness w4 is less than 0.015 μm. It is considered that this is caused by insufficient formation of the accumulation channel. A small characteristic on-resistance RonA is obtained when the thickness w4 is 0.015 μm or more. A small characteristic on-resistance RonA is obtained stably when the thickness w4 is 0.04 μm or more.

As shown in FIG. 3B, the breakdown voltage Vb decreases when the thickness w4 becomes large. For example, the breakdown voltage Vb decreases abruptly when the thickness w4 exceeds 0.45 μm.

In the embodiment, it is favorable for the thickness w4 to be, for example, not less than 0.015 μm and not more than 0.45 μm. Thereby, a small characteristic on-resistance RonA and a high breakdown voltage Vb are obtained. It is more favorable for the thickness w4 to be 0.04 μm or more. A small characteristic on-resistance RonA is obtained stably.

For example, the breakdown voltage Vb decreases easily when the first impurity concentration (the impurity concentration of the first conductivity type in the fourth semiconductor region 14) becomes high. Therefore, it is more favorable for the thickness w4 to be small (e.g., 0.40 μm or less) in the case where the first impurity concentration is high. From the perspective of the breakdown voltage Vb, it is more favorable for the thickness w4 to be 0.30 μm or less; and it is even more favorable for the thickness w4 to be 0.20 μm or less.

In the embodiment, considering a practical first electrode 21, for example, the thickness w4 is not less than 0.02 times and not more than 0.75 times a length w21 (the width) along the first direction D1 of the first electrode 21 when the thickness w4 is not less than 0.015 μm and not more than 0.45 μm.

In the embodiment, a high breakdown voltage can be maintained. In the embodiment, the maximum electric field of the first insulating film 31 (the gate insulating film) substantially does not degrade. In the embodiment, the high reliability of the gate insulating film can be maintained. It is possible to reduce the cell pitch. A low on-resistance is obtained.

As described above, the first impurity concentration (the impurity concentration of the first conductivity type in the fourth semiconductor region 14) is higher than the second impurity concentration (the impurity concentration of the first conductivity type in the first partial region 11a). For example, the first impurity concentration is not less than 1×10$^{17}$/cm$^3$ and not more than 5×10$^{18}$/cm$^3$. On the other hand, the second impurity concentration is, for example, not less than 1×10$^{15}$/cm$^3$ and not more than 1×10$^{18}$/cm$^3$.

When the first impurity concentration is lower than 1×10$^{17}$/cm$^3$, for example, the depletion region that extends from the third semiconductor region 13 toward the fourth semiconductor region 14 enlarges; and the accumulation channel is not formed easily. Therefore, there are cases where the on-resistance increases. When the first impurity concentration is higher than 5×10$^{18}$/cm$^3$, for example, the maximum electric field of the first insulating film 31 (the gate insulating film) of the trench side wall increases. Therefore, for example, there are cases where the reliability of the gate insulating film decreases. For example, there are cases where the breakdown voltage decreases.

There is a tendency for the maximum electric field applied to the first insulating film 31 (the gate insulating film) to be high when the thickness w4 is large. There is a tendency for the maximum electric field applied to the first insulating film 31 to be high when the first impurity concentration (the impurity concentration of the first conductivity type in the fourth semiconductor region 14) is high. An excessively high maximum electric field can be suppressed when the thickness w4 is 0.45 μm or less. For example, when the thickness w4 is 0.40 μm or less, the excessively high maximum electric field can be suppressed effectively even in the case where the first impurity concentration is high. From the perspective of the maximum electric field, it is more favorable for the thickness w4 to be 0.30 μm or less; and it is more favorable for the thickness w4 to be 0.20 μm or less.

An example of the change of the characteristics when the impurity concentrations in the semiconductor regions are changed will now be described. The impurity concentration of the fourth semiconductor region 14 and the impurity concentration of the fourth partial region 13d will be focused upon. For example, the first impurity concentration (the impurity concentration of the first conductivity type in the fourth semiconductor region 14) is modified.

On the other hand, the impurity concentration (an impurity concentration C13d) of the second conductivity type in the fourth partial region 13d is modified. As described below, for example, the fourth partial region 13d may be formed by ion-implanting the impurity of the second conductivity type into a semiconductor region of the first conductivity type. In such a case, the fourth partial region 13d also includes the impurity of the first conductivity type in addition to the impurity of the second conductivity type. However, the impurity concentration of the first conductivity type included in the fourth partial region 13d is sufficiently low compared to the impurity concentration of the second conductivity type. The impurity concentration C13d of the fourth partial region 13d (the impurity concentration of the second conductivity type) may be considered to correspond to the effective carrier concentration of the fourth partial region 13d.

On the other hand, the fourth semiconductor region 14 also is formed by, for example, ion implantation. For example, the fourth semiconductor region 14 also includes the impurity of the first conductivity type and the impurity of the second conductivity type. In the following model, the impurity concentration (the second impurity concentration) of the second conductivity type included in the fourth semiconductor region 14 is the same as the impurity concentration of the second conductivity type included in the fourth partial region 13d. In such a case, the impurity concentration (the first impurity concentration) of the first conductivity type included in the fourth semiconductor region 14 is modified.

Figure 4A:
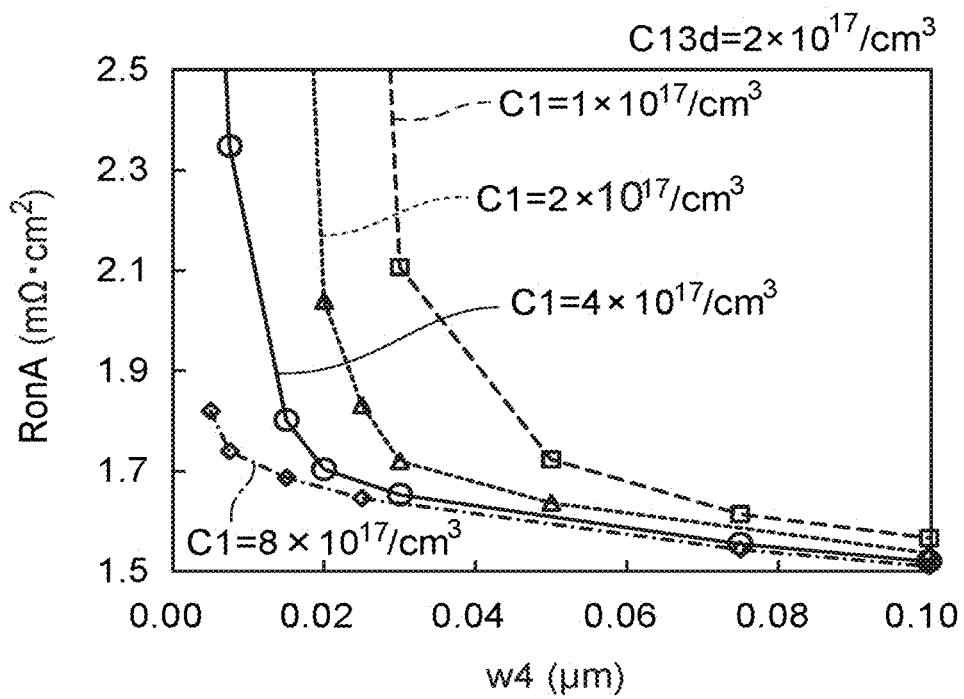
FIG. 4A and FIG. 4B are graphs illustrating the characteristics of the semiconductor device.
Figure 4B:
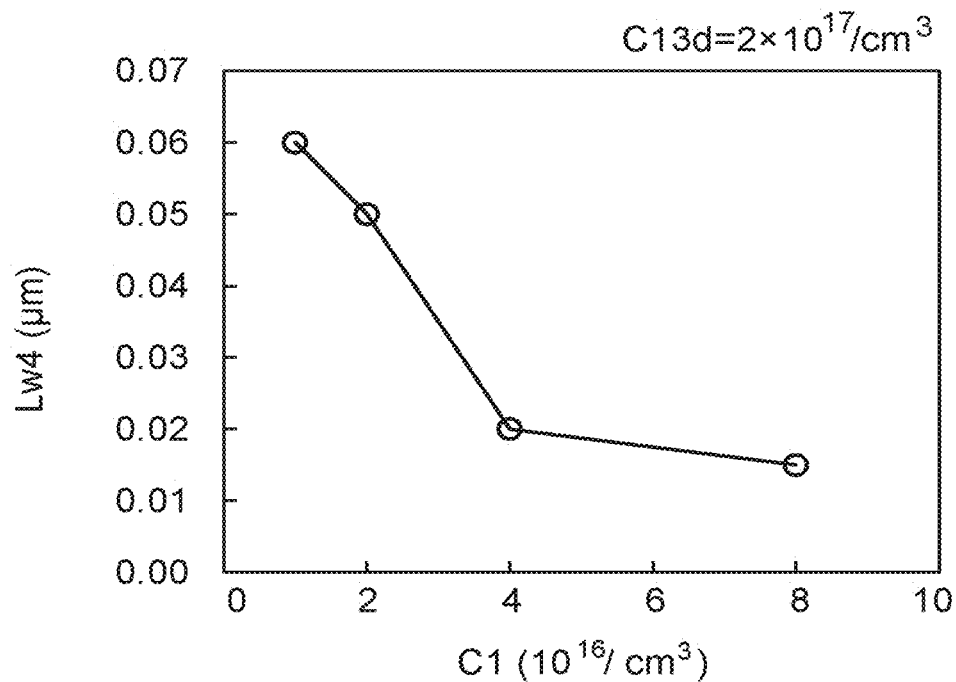

FIG. 4A and FIG. 4B are graphs illustrating the characteristics of the semiconductor device.

These figures illustrate the simulation results of the characteristics when a first impurity concentration C1 (the impurity concentration of the first conductivity type in the fourth semiconductor region 14) is changed. In the simulation, the impurity concentration C13d of the second conductivity type in the fourth partial region 13d is constant and is $2\times10^{17}/\text{cm}^3$. In such a case, the first impurity concentration C1 is modified. Otherwise, the conditions are the same as those described in reference to FIG. 2. The horizontal axis of FIG. 4A is the thickness w4. The vertical axis of FIG. 4A is the characteristic on-resistance RonA.

It can be seen from FIG. 4A that the characteristic on-resistance RonA becomes small when the first impurity concentration C1 is high. The characteristic on-resistance RonA increases abruptly when the thickness w4 (the width) becomes narrow (becomes small). Even for four types of the first impurity concentration C1, the characteristic on-resistance RonA increases abruptly when the characteristic on-resistance RonA exceeds 1.7 mΩ·cm². If the characteristic on-resistance RonA is 1.7 mΩ·cm² or less, a small characteristic on-resistance RonA is obtained even when the width w4 is changed.

A width parameter Lw4 that relates to the width w4 is introduced. The width parameter Lw4 is the minimum thickness w4 (the width) at where the characteristic on-resistance RonA is 1.7 mΩ·cm² or less. From the results of FIG. 4A, the width parameter Lw4 can be derived for the four types of the first impurity concentration C1.

The horizontal axis of FIG. 4B is the first impurity concentration C1. The vertical axis of FIG. 4B is the width parameter Lw4 (μm). The width parameter Lw4 becomes small when the first impurity concentration C1 becomes high. For example, if the first impurity concentration C1 is high, a small characteristic on-resistance RonA is obtained even when the width w4 is small.

Figure 5:
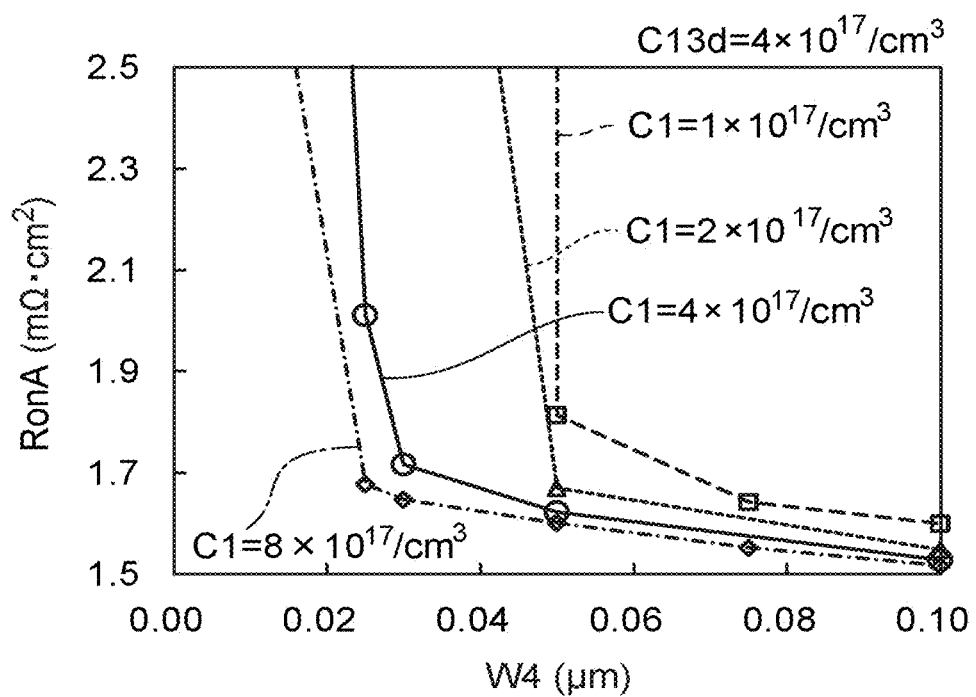
FIG. 5 is a graph illustrating the characteristics of the semiconductor device.

FIG. 5 is a graph illustrating the characteristics of the semiconductor device.

In FIG. 5, the impurity concentration C13d of the second conductivity type in the fourth partial region 13d is $4\times10^{17}/\text{cm}^3$. The horizontal axis of FIG. 5 is the thickness w4. The vertical axis of FIG. 5 is the characteristic on-resistance RonA. It can be seen from FIG. 5 that if the first impurity concentration C1 is high, the characteristic on-resistance RonA is small even in the case where the impurity concentration C13d of the second conductivity type in the fourth partial region 13d is $4\times10^{17}/\text{cm}^3$. The characteristic on-resistance RonA increases abruptly when the thickness w4 (the width) becomes narrow (becomes small). Comparing FIG. 4A and FIG. 5, the width w4 at which the characteristic on-resistance RonA is 1.7 mΩ·cm² or less changes due to the first impurity concentration C1 and the impurity concentration C13d.

Characteristics when the relative relationship between the first impurity concentration C1 and the impurity concentration C13d is changed will now be described. As described above, the fourth semiconductor region 14 includes the impurity of the first conductivity type and the impurity of the second conductivity type. The impurity concentration of the first conductivity type in the fourth semiconductor region 14 is the first impurity concentration C1. The impurity concentration of the second conductivity type in the fourth semiconductor region 14 is the second impurity concentration. The second impurity concentration is the same as the impurity concentration C13d.

A concentration parameter RC for the impurity concentration is introduced. The concentration parameter RC is (C1−C13d)/C13d. (C1−C13d) corresponds to the difference between the second impurity concentration and the first impurity concentration in the fourth semiconductor region 14. (C1−C13d) corresponds to the effective impurity concentration (the effective impurity concentration of the first conductivity type) in the fourth semiconductor region 14. On the other hand, as described above, the impurity concentration of the first conductivity type in the fourth partial region 13d is sufficiently low. Therefore, the impurity concentration C13d corresponds to the effective carrier concentration (the effective impurity concentration of the second conductivity type) in the fourth partial region 13d.

FIG. 6A, FIG. 6B, FIG. 7A, and FIG. 7B are graphs illustrating the characteristics of the semiconductor device.

Figure 6A:
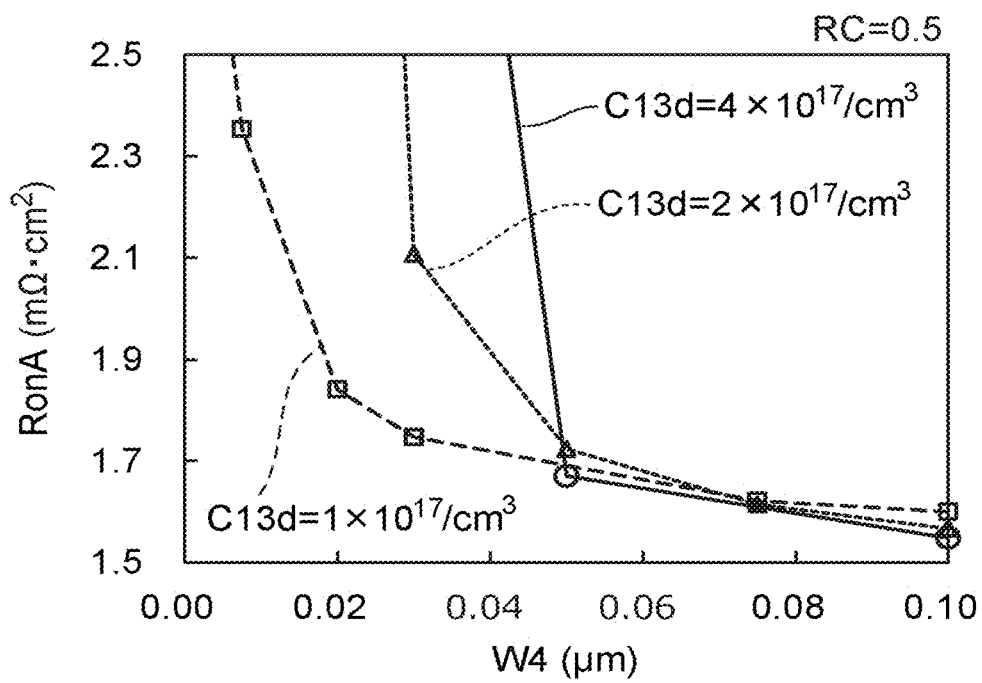
FIG. 6A and FIG. 6B are graphs illustrating the characteristics of the semiconductor device.
Figure 6B:
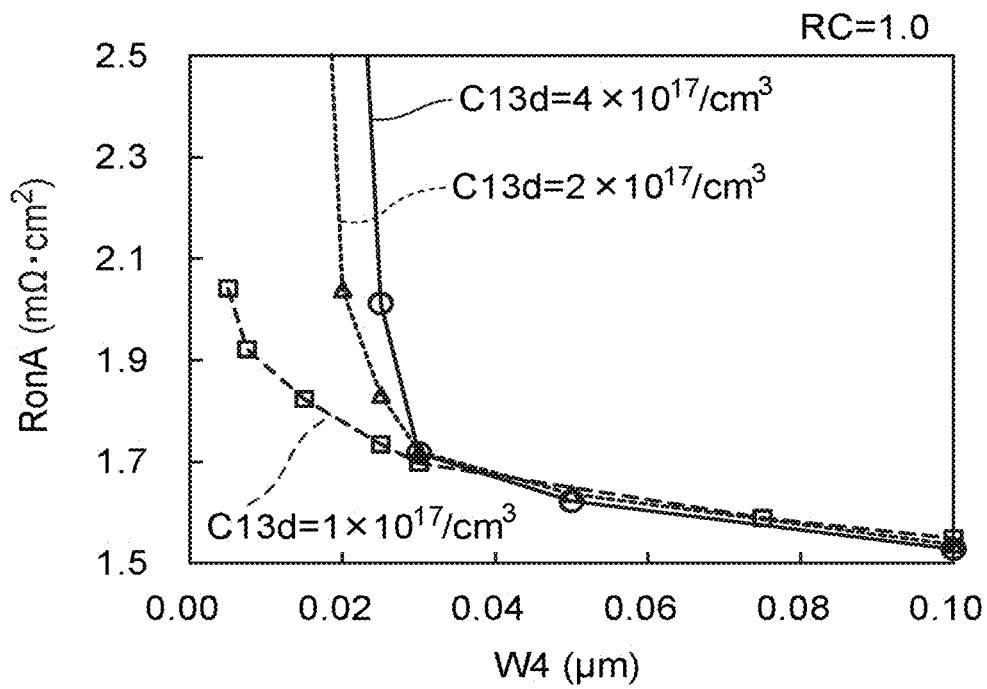
Figure 7A:
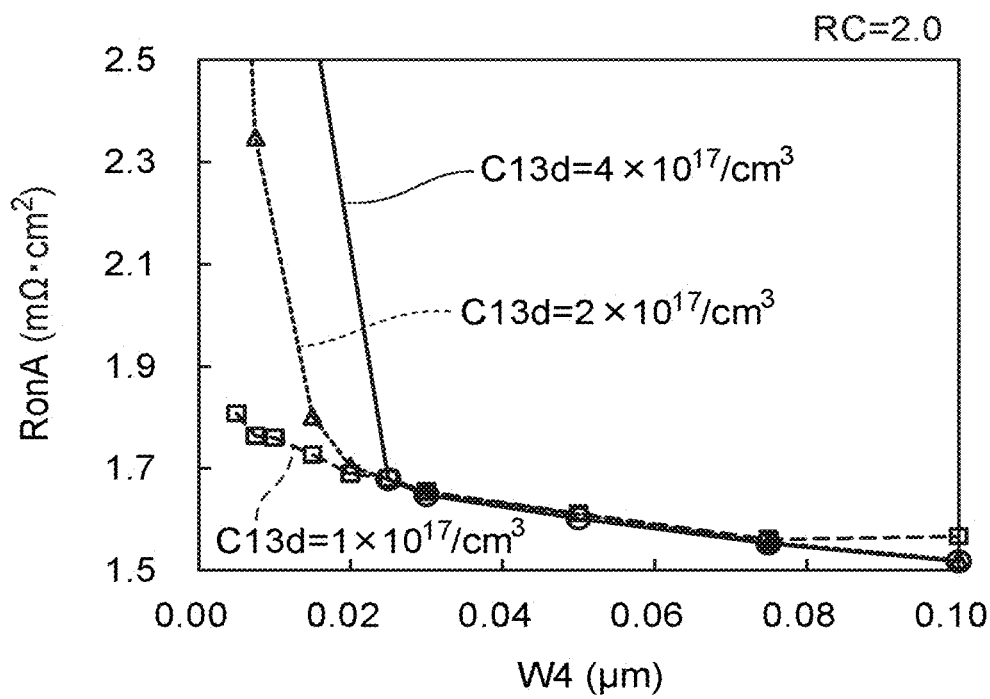
FIG. 7A and FIG. 7B are graphs illustrating the characteristics of the semiconductor device.
Figure 7B:
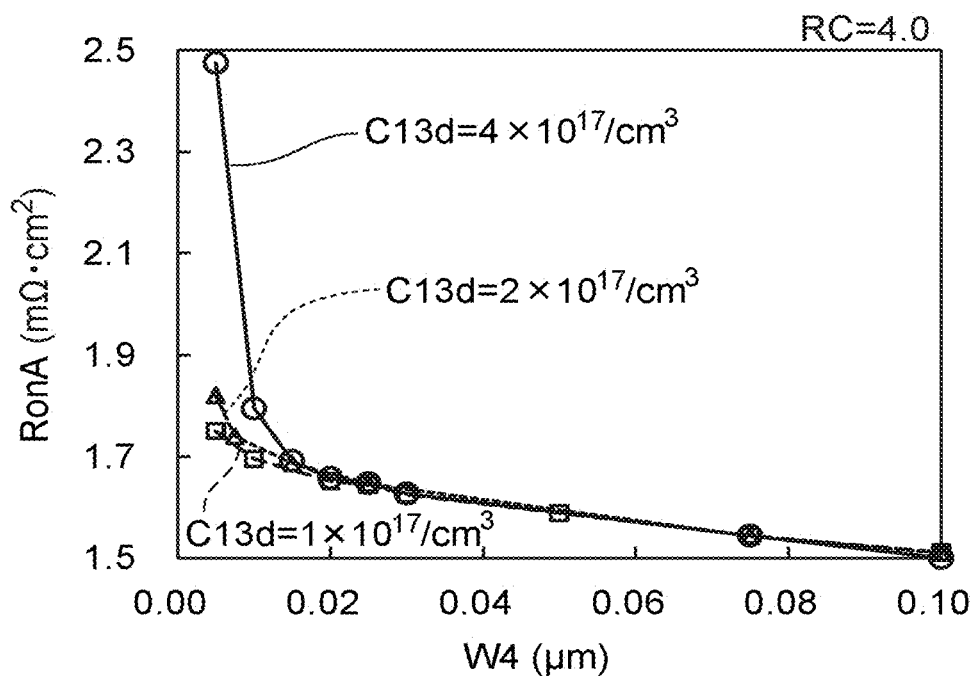

In FIG. 6A, the concentration parameter RC is 0.5. In FIG. 6B, the concentration parameter RC is 1.0. In FIG. 7A, the concentration parameter RC is 2.0. In FIG. 7B, the concentration parameter RC is 4.0. The impurity concentration C13d of the second conductivity type in the fourth partial region 13d is modified in these figures. In these figures, the horizontal axis is the thickness w4. The vertical axis is the characteristic on-resistance RonA.

It can be seen from these figures that the characteristic on-resistance RonA becomes small when the impurity concentration C13d is low. The characteristic on-resistance RonA increases abruptly when the thickness w4 (the width) becomes narrow (becomes small).

Figure 8:
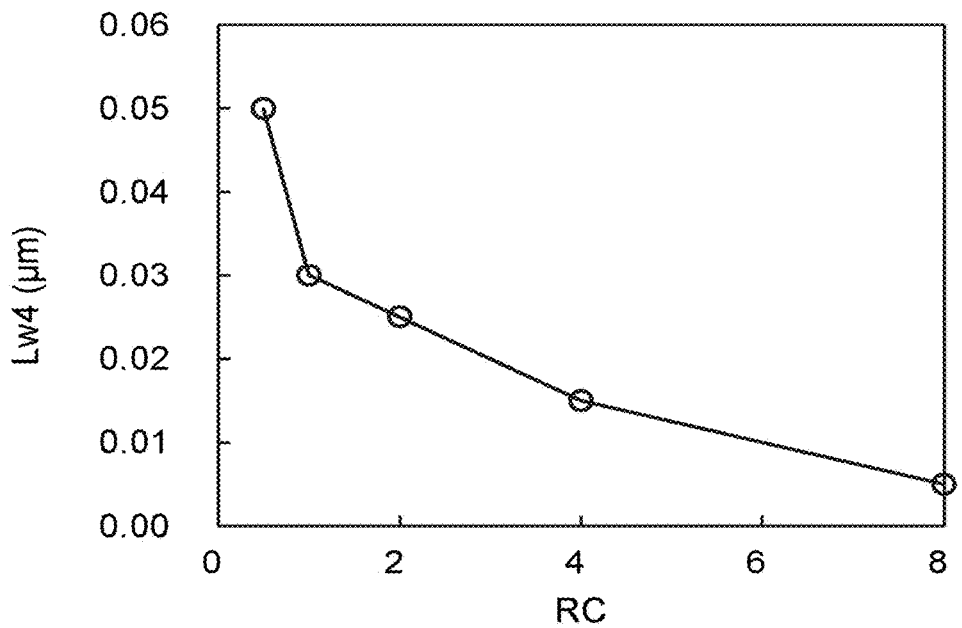
FIG. 8 is a graph illustrating a characteristic of the semiconductor device.

FIG. 8 is a graph illustrating a characteristic of the semiconductor device.

The horizontal axis of FIG. 8 is the concentration parameter RC. The vertical axis of FIG. 8 is the width parameter Lw4. It can be seen from FIG. 8 that the width parameter Lw4 is small when the concentration parameter RC is high. If the concentration parameter RC is high, a small characteristic on-resistance RonA is obtained even when the thickness w4 (the width) is small.

For example, there are cases where a depletion layer is formed between the fourth semiconductor region 14 and the fourth partial region 13d. For example, the depletion layer extends along the X-axis direction. It is considered that the width of the depletion layer extending toward the fourth semiconductor region 14 is suppressed to be narrow when the impurity concentration C13d of the second conductivity type (corresponding to the impurity concentration of the second conductivity type in the fourth semiconductor region 14) is constant and the first impurity concentration C1 (the impurity concentration of the first conductivity type in the fourth semiconductor region 14) increases. Thereby, it is considered that a wide current path is obtained; and a low on-resistance is obtained.

As shown in FIG. 1A, for example, the fifth partial region 13e of the third semiconductor region 13 does not overlap the second insulating region 31b of the first insulating film 31 in the first direction D1 (e.g., the X-axis direction). The fifth partial region 13e is provided on the first partial region 11a. The lower end of the third semiconductor region 13 is positioned lower than the lower end of the first insulating film 31.

A portion of the first electrode 21 in the first direction D1 (e.g., the X-axis direction) overlaps a portion of the fourth semiconductor region 14. For example, the lower end of the first electrode 21 is positioned higher than the lower end of the fourth semiconductor region 14.

In the example, the fourth semiconductor region 14 further includes the second portion 14q in addition to the first portion 14p. The second portion 14q overlaps the first insulating region 31a in the second direction D2 (the Z-axis direction). The second portion 14q may overlap a portion of the second insulating region 31b in the second direction D2 (the Z-axis direction). The second portion 14q may overlap a portion of the first electrode 21 in the second direction D2 (the Z-axis direction). The second portion 14q is continuous with the first portion 14p.

For example, the thickness w4 along the first direction D1 of the first portion 14p (referring to FIG. 1A) is, for example, not less than 0.02 times and not more than 0.75 times the length w21 (the width) along the first direction D1 of the first electrode 21. The thickness w4 along the first direction D1 of the first portion 14p is, for example, not less than 0.15 times and not more than 0.75 times the length ta along the first direction D1 (e.g., the X-axis direction) of the first insulating region 31a.

In the example shown in FIG. 1A, the thickness of the bottom portion of the first insulating film 31 is thicker than the thickness of the side portion. For example, the length ta along the first direction D1 (e.g., the X-axis direction) of the first insulating region 31a is shorter than the length tb along the second direction D2 (e.g., the Z-axis direction) of the second insulating region 31b. By setting the thickness of the bottom portion to be thicker than the thickness of the side portion, for example, the maximum electric field of the first insulating film 31 (the gate insulating film) can be suppressed.

As described above, the impurity concentration of the second conductivity type in the third semiconductor region 13 increases upward. The fifth partial region 13e, the fourth partial region 13d, and the third partial region 13c recited above are provided in the third semiconductor region 13.

A length to along the second direction D2 of the fifth partial region 13e (referring to FIG. 1A) is, for example, not less than 0.10 μm and not more than 0.40 μm. The impurity concentration of the second conductivity type in the fifth partial region 13e is, for example, not less than $1 \times 10^{15}/cm^3$ and not more than $1 \times 10^{18}/cm^3$.

A length td along the second direction D2 of the fourth partial region 13d (referring to FIG. 1A) is, for example, not less than 0.20 μm and not more than 0.50 μm. The impurity concentration of the second conductivity type in the fourth partial region 13d is, for example, greater than $5 \times 10^{16}/cm^3$ but not more than $1 \times 10^{18}/cm^3$.

A length tc along the second direction D2 of the third partial region 13c (referring to FIG. 1A) is, for example, not less than 0.30 μm and not more than 0.50 μm. The impurity concentration of the second conductivity type in the third partial region 13c is, for example, greater than $1 \times 10^{17}/cm^3$ but not more than $3 \times 10^{18}/cm^3$.

A length d31 along the second direction D2 of the first insulating film 31 is, for example, not less than 0.7 μm and not more than 1.0 μm. A length w31 along the first direction D1 of the first insulating film 31 is, for example, not less than 0.5 μm and not more than 1.0 μm.

For example, the lower end of the bottom portion of the first insulating film 31 is positioned shallower than the upper end of the fourth semiconductor region 14.

The lower end of the first electrode 21 is positioned deeper than the upper end of the fourth semiconductor region 14.

In the embodiment, the first electrode 21 includes, for example, polysilicon. The first electrode 21 may include at least one of N, B, P, As, or Al. At least one of the second electrode 22 or the third electrode 23 includes, for example, a metal such as at least one of Ni, Ti, Al, Au, Pt, W, or Mo.

At least one of the first insulating film 31 or the second insulating film 32 includes at least one of silicon oxide, silicon nitride, silicon oxynitride, or aluminum oxide.

The description recited above relating to the materials is an example; and these electrodes and insulating films may include other materials in the embodiment.

An example of the method for manufacturing the semiconductor device 110 will now be described.

FIG. 9A to FIG. 9D are schematic cross-sectional views in order of the processes, illustrating the method for manufacturing the semiconductor device according to the first embodiment.

Figure 9A:
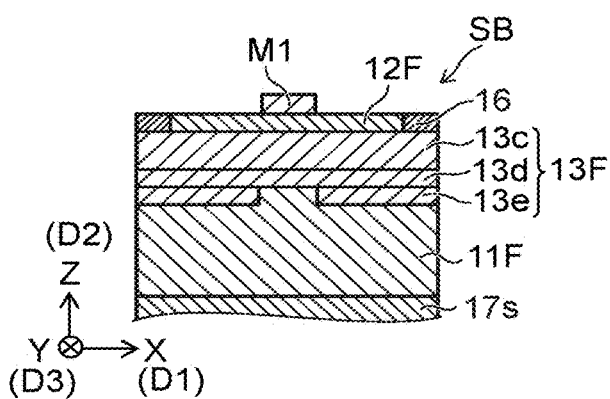
FIG. 9A to FIG. 9D are schematic cross-sectional views in order of the processes, illustrating the method for manufacturing the semiconductor device according to the first embodiment.

A stacked body SB is prepared as shown in FIG. 9A. The stacked body SB includes a first semiconductor film 11F of the first conductivity type provided on a substrate 17s, a third semiconductor film 13F of the second conductivity type provided on the first semiconductor film 11F, and a second semiconductor film 12F of the first conductivity type provided on the third semiconductor film 13F. For example, the substrate 17s is used to form the seventh semiconductor region 17. The substrate 17s and the semiconductor films recited above include, for example, silicon carbide.

For example, the third semiconductor film 13F includes the fifth partial region 13e, the fourth partial region 13d, and the third partial region 13c.

The concentration of the impurity of the second conductivity type (e.g., the p-type) in the fifth partial region 13e is, for example, not less than $1\times10^{15}/cm^3$ and not more than $1\times10^{18}/cm^3$.

The fourth partial region 13d is provided on the fifth partial region 13e. The concentration of the impurity of the second conductivity type (e.g., the p-type) in the fourth partial region 13d is, for example, greater than $5\times10^{16}/cm^3$ but not more than $1\times10^{18}/cm^3$.

The third partial region 13c is provided on the fourth partial region 13d. The concentration of the impurity of the second conductivity type (e.g., the p-type) in the third partial region 13c is, for example, greater than $1\times10^{17}/cm^3$ but not more than $3\times10^{18}/cm^3$.

In the example, the stacked body SB further includes the sixth semiconductor region 16. For example, the layer that includes the first semiconductor region 11 is formed by epitaxial growth. Subsequently, the second semiconductor film 12F and the sixth semiconductor region 16 are formed by, for example, ion implantation. The third semiconductor region 13 is provided by ion implantation using a mask M1. The first semiconductor film 11F includes a region overlapping the mask M1; and the impurity of the second conductivity type is not introduced to this region.

Subsequently, the mask M1 is removed.

Figure 9B:
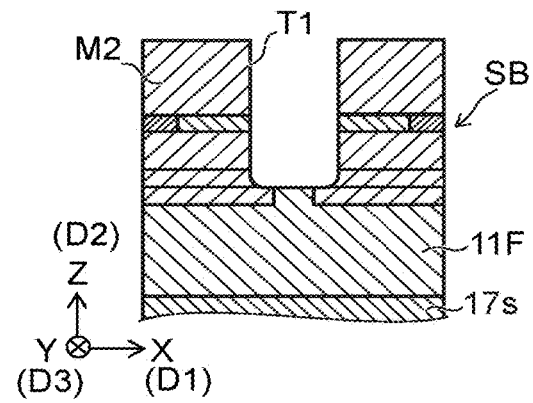

As shown in FIG. 9B, a trench T1 is formed in the stacked body SB from the second semiconductor film 12F side. For example, a mask M2 is formed on the second semiconductor film 12F and the sixth semiconductor region 16. The mask M2 is, for example, a silicon oxide film. The trench T1 is formed in the opening of the mask M2 by performing processing such as, for example, RIE (Reactive Ion Etching), etc.

For example, the trench T1 extends along the (11-20) plane of silicon carbide. The trench T1 may extend along the (1-100) plane of silicon carbide.

Figure 9C:
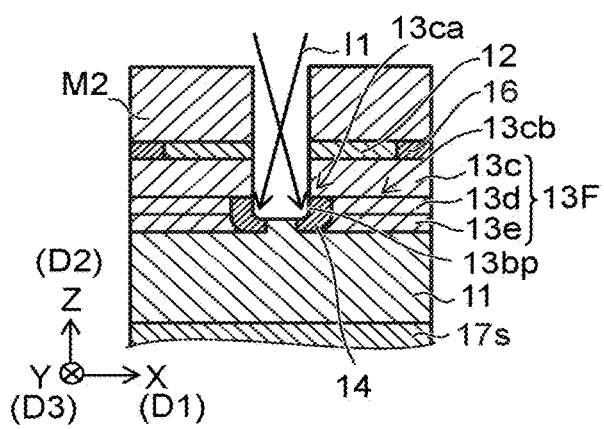

As shown in FIG. 9C, an impurity I1 of the first conductivity type (e.g., the n-type) is introduced to the side surface of the third semiconductor film 13F. The introduction includes, for example, ion implantation. The introduction of the impurity I1 may be performed to the entire surface of the side surface of the third semiconductor film 13F.

As described above, the third semiconductor film 13F includes the fifth partial region 13e (the lowermost portion), the fourth partial region 13d (the lower portion), and the third partial region 13c (the upper portion). The concentration of the impurity of the second conductivity type (e.g., the p-type) is high in the third partial region 13c. Therefore, the conductivity type of the third partial region 13c is the p-type even after the impurity I1 of the first conductivity type (e.g., the n-type) is introduced. On the other hand, the concentration of the impurity of the second conductivity type (e.g., the p-type) is low in the fifth partial region 13e (the lowermost portion) and the fourth partial region 13d (the lower portion). Therefore, the conductivity type of these regions is the n-type after the impurity I1 of the first conductivity type (e.g., the n-type) is introduced.

For example, the impurity I1 may be introduced to the lower portion of the side surface of the third semiconductor film 13F. The side surface of the third semiconductor film 13F includes a lower portion 13bp. The lower portion 13bp is exposed at the side wall of the trench T1. The impurity I1 may be introduced to the lower portion 13bp of the side surface of the third semiconductor film 13F. The introduction includes, for example, ion implantation.

The impurity concentration of the first conductivity type in the lower portion 13bp is higher than the concentration of the impurity of the second conductivity type in the lower portion 13bp. Thereby, the fourth semiconductor region 14 that is of the first conductivity type is formed. On the other hand, in the upper portion, the p-type impurity concentration is higher than the n-type impurity after the impurity I1 is introduced. This region is used to form a portion of the third semiconductor region 13. The impurity concentration of the first conductivity type in the fourth semiconductor region 14 is higher than the impurity concentration of the first conductivity type in the first semiconductor region 11.

For example, the third partial region 13c includes a region (a first region 13ca referring to FIG. 9C) proximal to the first insulating film 31, and a region (a second region 13cb referring to FIG. 9C) distal to the first insulating film 31. The first region 13ca is positioned between the second region 13cb and the first insulating film 31 in the X-axis direction (the first direction D1). For example, the impurity concentration of the first conductivity type (the n-type) in the first region 13ca is higher than the impurity concentration of the first conductivity type (the n-type) in the second region 13cb. For example, the difference between the impurity concentration of the first conductivity type and the impurity concentration of the second conductivity type in the first region 13ca is smaller than the difference between the impurity concentration of the first conductivity type and the impurity concentration of the second conductivity type in the second region 13cb.

Figure 9D:
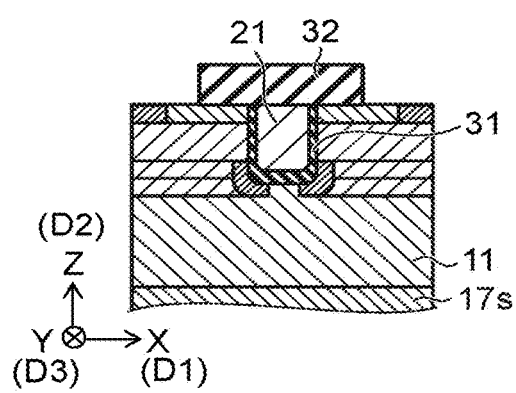

As shown in FIG. 9D, the first insulating film 31 is formed on the surface of the trench T1 after the impurity I1 is introduced to the lower portion 13bp. The first electrode 21 is formed by introducing a conductive material into the remaining space of the trench T1 after the formation of the first insulating film 31.

Subsequently, the second insulating film 32, the second electrode 22, and the third electrode 23 are formed. Thereby, the semiconductor device 110 can be manufactured.

According to the manufacturing method recited above, a method for manufacturing a semiconductor device can be provided in which the on-resistance can be reduced.

In the manufacturing method recited above, the first electrode 21 and the first insulating film 31 are formed self-aligningly with respect to the fourth semiconductor region 14. The positional precision of the fourth semiconductor region 14 with respect to the first electrode 21 and the first insulating film 31 is high. Even when the cell pitch is reduced, the fluctuation of the width of the current path is small. For example, the decrease of the accumulation resistance is easy.

In the case where the fourth semiconductor region 14 is formed using the manufacturing method recited above, the fourth semiconductor region 14 includes the impurity of the second conductivity type and the impurity of the first conductivity type. For example, the fourth semiconductor region 14 includes the Group III element and the Group V element.

For example, in the semiconductor device 110, the difference between the first impurity concentration (the impurity concentration of the first conductivity type in the fourth semiconductor region 14) and the impurity concentration of the second conductivity type in the fourth semiconductor region 14 (the third impurity concentration) is taken as a first difference. The first impurity concentration is higher than the third impurity concentration.

On the other hand, the first semiconductor region 11 (the first partial region 11a) includes the impurity of the first conductivity type and may not include the impurity of the second conductivity type. In the case where the first semiconductor region 11 (the first partial region 11a) includes the impurity of the second conductivity type in addition to the impurity of the first conductivity type, the difference between the second impurity concentration (the impurity concentration of the first conductivity type in the first partial region 11a) and the impurity concentration (the fourth impurity concentration) of the second conductivity type in the first partial region 11a is taken as a second difference. The second impurity concentration is higher than the fourth impurity concentration.

In the embodiment, the first difference is larger than the second difference. The first difference is, for example, not less than 10 times and not more than 60 times the second difference.

Second Embodiment

Figure 10A:
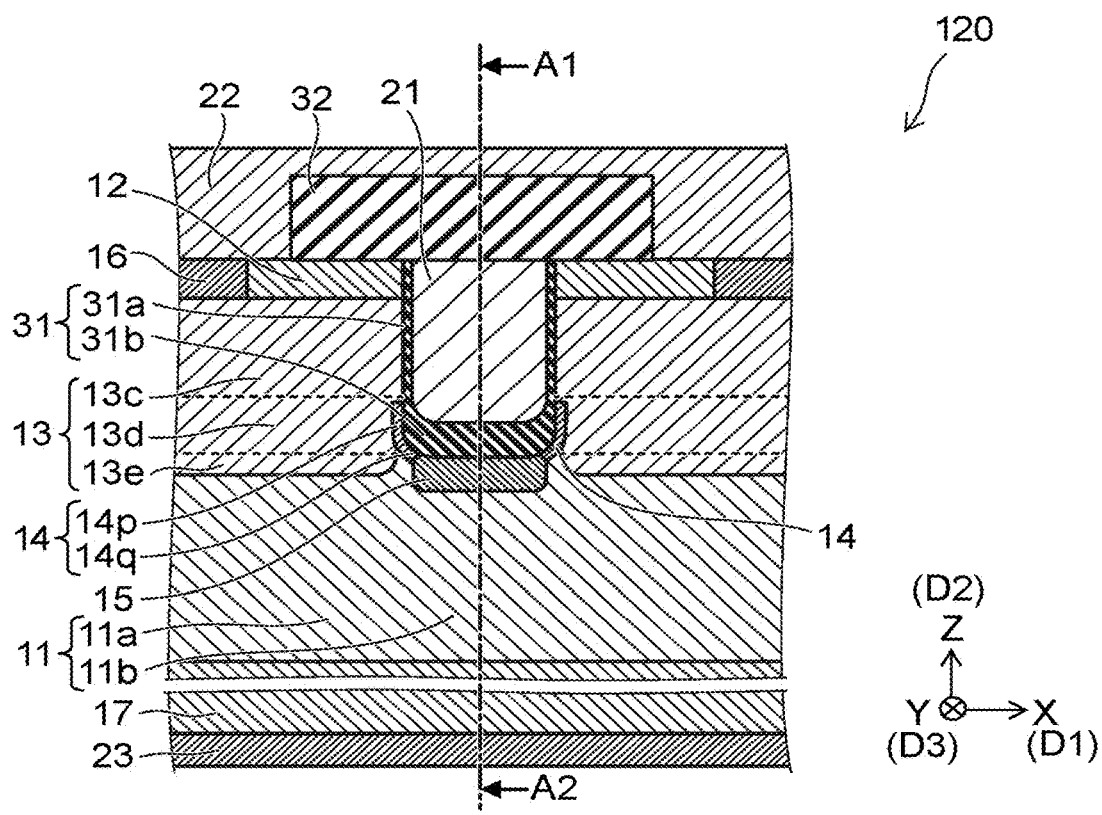
FIG. 10A and FIG. 10B are schematic views illustrating a semiconductor device according to a second embodiment.
Figure 10B:
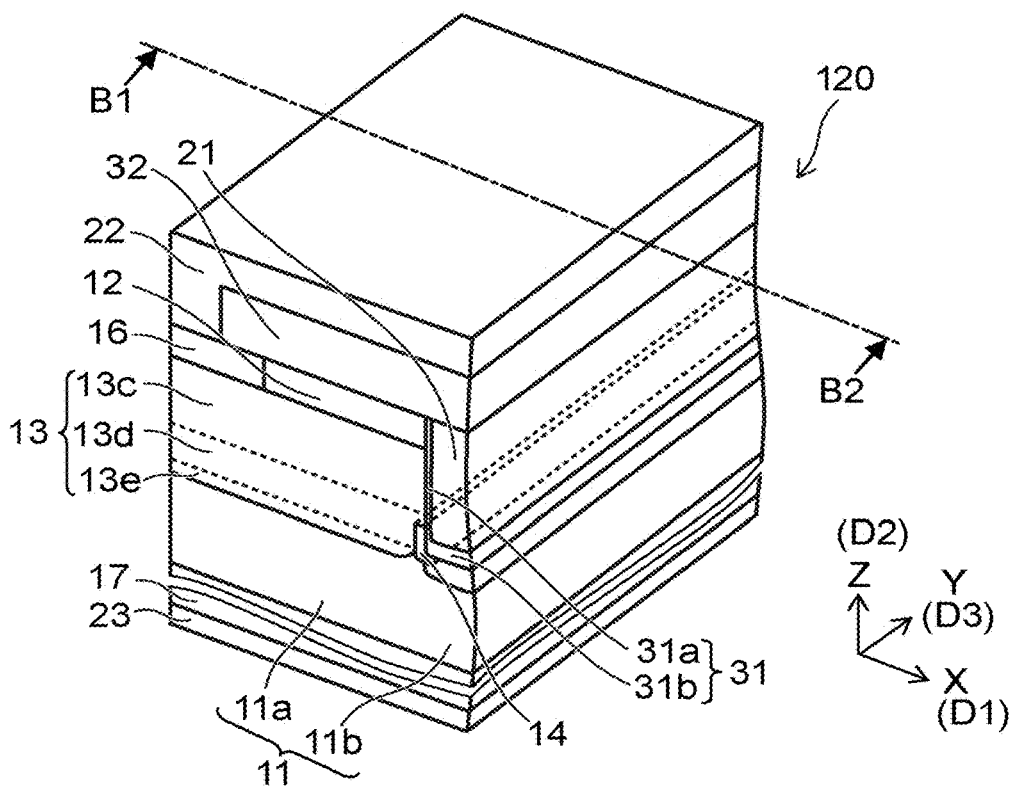

FIG. 10A and FIG. 10B are schematic views illustrating a semiconductor device according to a second embodiment.

FIG. 10A is a cross-sectional view corresponding to a cross section along line B1-B2 shown in FIG. 10B. FIG. 1B is a perspective view when cut along line A1-A2 of FIG. 1A.

As shown in FIG. 10A and FIG. 10B, the semiconductor device 120 according to the embodiment further includes the fifth semiconductor region 15 in addition to the first to fourth semiconductor regions 11 to 14, the first electrode 21, and the first insulating film 31. Otherwise, the semiconductor device 120 is similar to the semiconductor device 110. For example, the semiconductor device 120 may further include the sixth semiconductor region 16, the seventh semiconductor region 17, the second electrode 22, the third electrode 23, and the second insulating film 32. The fifth semiconductor region 15 will now be described. A description is omitted for the portions similar to those of the semiconductor device 110.

In the semiconductor device 120, the fifth semiconductor region 15 is provided between the second partial region 11b and the first insulating film 31 in the second direction D2 (e.g., the Z-axis direction). The fifth semiconductor region 15 is of the first conductivity type (e.g., the n-type). The fifth semiconductor region 15 is provided under the first electrode 21. The fifth semiconductor region 15 includes, for example, silicon carbide.

The impurity concentration of the first conductivity type in the fifth semiconductor region 15 is higher than the impurity concentration of the first conductivity type in the second partial region 11b. The impurity concentration of the first conductivity type in the fifth semiconductor region 15 may be lower than the first impurity concentration (the impurity concentration of the first conductivity type in the fourth semiconductor region 14).

The impurity concentration of the second conductivity type in the fifth semiconductor region 15 is, for example, not less than $1 \times 10^{15}/cm^3$ and not more than $4 \times 10^{17}/cm^3$. The impurity concentration of the second conductivity type in the fourth semiconductor region 14 is, for example, not less than $1 \times 10^{17}/cm^3$ and not more than $5 \times 10^{18}/cm^3$. The impurity concentration of the second conductivity type in the first semiconductor region 11 (e.g., the first partial region 11a) is, for example, not less than $1 \times 10^{15}/cm^3$ and not more than $8 \times 10^{16}/cm^3$.

A low on-resistance is obtained in such a semiconductor device 120 as well. In the embodiment, an even lower on-resistance is obtained because the reduction of the cell pitch is easy.

For example, as described above, the third semiconductor region 13 includes the fifth partial region 13e. The fifth partial region 13e is provided between the fourth partial region 13d and the first partial region 11a in the second direction D2 (e.g., the Z-axis direction). The fifth partial region 13e overlaps the fifth semiconductor region 15 in the first direction D1 (e.g., the X-axis direction).

For example, the fifth semiconductor region 15 may include the impurity of the second conductivity type. For example, the fifth semiconductor region 15 may include a Group III element and a Group V element. For example, the difference between the impurity concentration of the first conductivity type in the fifth semiconductor region 15 and the impurity concentration of the second conductivity type in the fifth semiconductor region 15 is larger than the difference between the impurity concentration of the first conductivity type in the first partial region 11a and the impurity concentration of the second conductivity type in the first partial region 11a.

An example of a method for manufacturing the semiconductor device 120 will now be described.

At least a portion of the method for manufacturing the semiconductor device 110 is applicable to the method for manufacturing the semiconductor device 120.

FIG. 11A to FIG. 11E are schematic cross-sectional views in order of the processes, illustrating the method for manufacturing the semiconductor device according to the second embodiment.

Figure 11A:
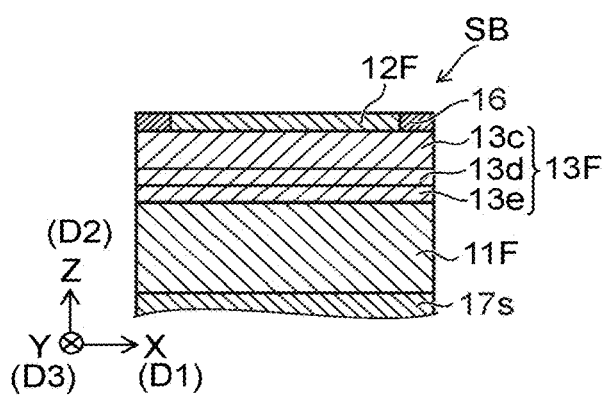
FIG. 11A to FIG. 11E are schematic cross-sectional views in order of the processes, illustrating the method for manufacturing the semiconductor device according to the second embodiment.

The stacked body SB is prepared as shown in FIG. 11A. The stacked body SB includes the first semiconductor film 11F of the first conductivity type provided on the substrate 17s, the third semiconductor film 13F of the second conductivity type provided on the first semiconductor film 11F, and the second semiconductor film 12F of the first conductivity type provided on the third semiconductor film 13F. For example, the substrate 17s is used as the seventh semiconductor region 17. The substrate 17s and the semiconductor films recited above include, for example, silicon carbide. For example, the third semiconductor film 13F includes the fifth partial region 13e, the fourth partial region 13d, and the third partial region 13c. In the example, the stacked body SB further includes the sixth semiconductor region 16.

Figure 11B:
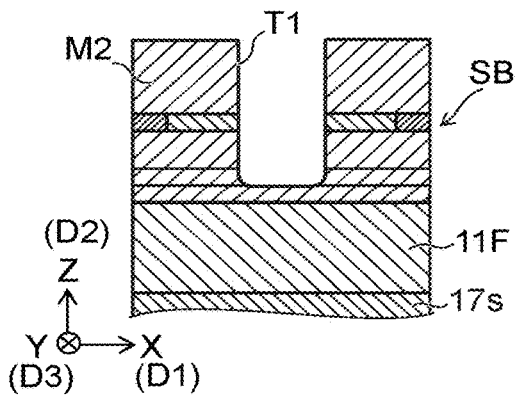

As shown in FIG. 11B, the trench T1 is formed in the stacked body SB from the second semiconductor film 12F.

Figure 11C:
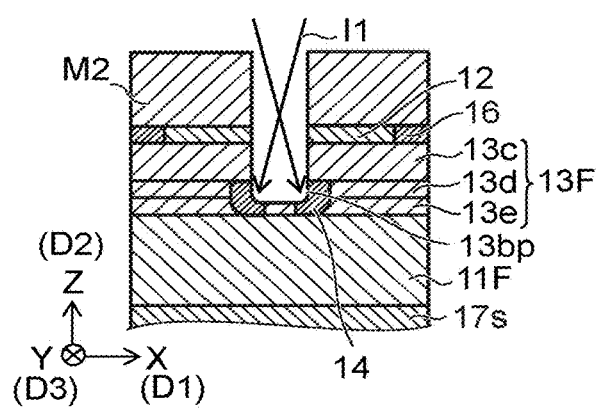

As shown in FIG. 11C, the side surface of the third semiconductor film 13F includes the lower portion 13bp. The lower portion 13bp is exposed at the side wall of the trench T1. The impurity I1 of the first conductivity type (e.g., the n-type) is introduced to the lower portion 13bp of the side surface of the third semiconductor film 13F. The introduction includes, for example, ion implantation.

Figure 11D:
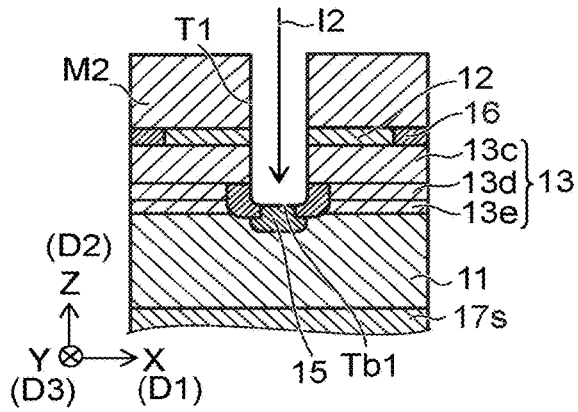

The trench T1 includes a bottom portion Tb1 as shown in FIG. 11D. For example, a portion (e.g., the fifth partial region 13e) of the third semiconductor film 13F is exposed at the bottom portion Tb1. An impurity I2 of the first conductivity type is introduced to the bottom portion Tb1 of the trench T1. Thereby, a portion of the fifth partial region 13e corresponding to the bottom portion Tb1 is of the first conductivity type. This portion is used as the fifth semiconductor region 15. The region where the impurity I2 is substantially not introduced is used as a portion of the third semiconductor region 13.

As shown in FIG. 11C and FIG. 11D, the angle between the introduction direction of the impurity I1 and the second direction D2 (the stacking direction of the stacked body SB) is smaller than the angle between the introduction direction of the impurity I2 and the second direction D2. The fourth semiconductor region 14 is easy to form due to the introduction of such an impurity I1. The fifth semiconductor region 15 is easy to form due to the introduction of such an impurity I2. The formation of the fourth semiconductor region 14 and the formation of the fifth semiconductor region 15 are performed substantially independently from each other. The controllability of the formation of these semiconductor regions increases.

Figure 11E:
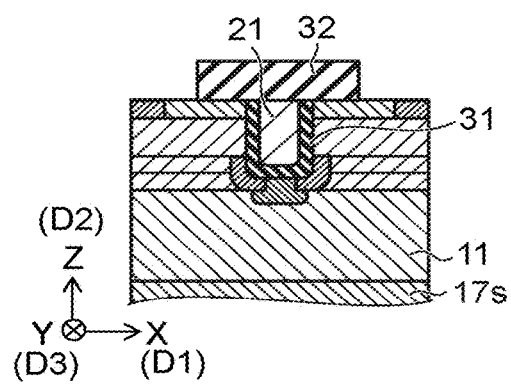

As shown in FIG. 11E, the first insulating film 31 is formed on the surface of the trench T1 after the introduction of the impurity I1 to the lower portion 13bp. The first electrode 21 is formed by introducing a conductive material to the remaining space of the trench T1 after the formation of the first insulating film 31.

Subsequently, the second insulating film 32, the second electrode 22, and the third electrode 23 are formed. Thereby, the semiconductor device 120 can be manufactured.

Thus, in the manufacturing method recited above, the impurity of the first conductivity type is introduced to the bottom portion Tb1 of the trench T1 prior to the formation of the first insulating film 31. Thereby, the fifth semiconductor region 15 can be formed.

According to the manufacturing method recited above, a method for manufacturing a semiconductor device can be provided in which the on-resistance can be reduced.

Third Embodiment

Figure 12:
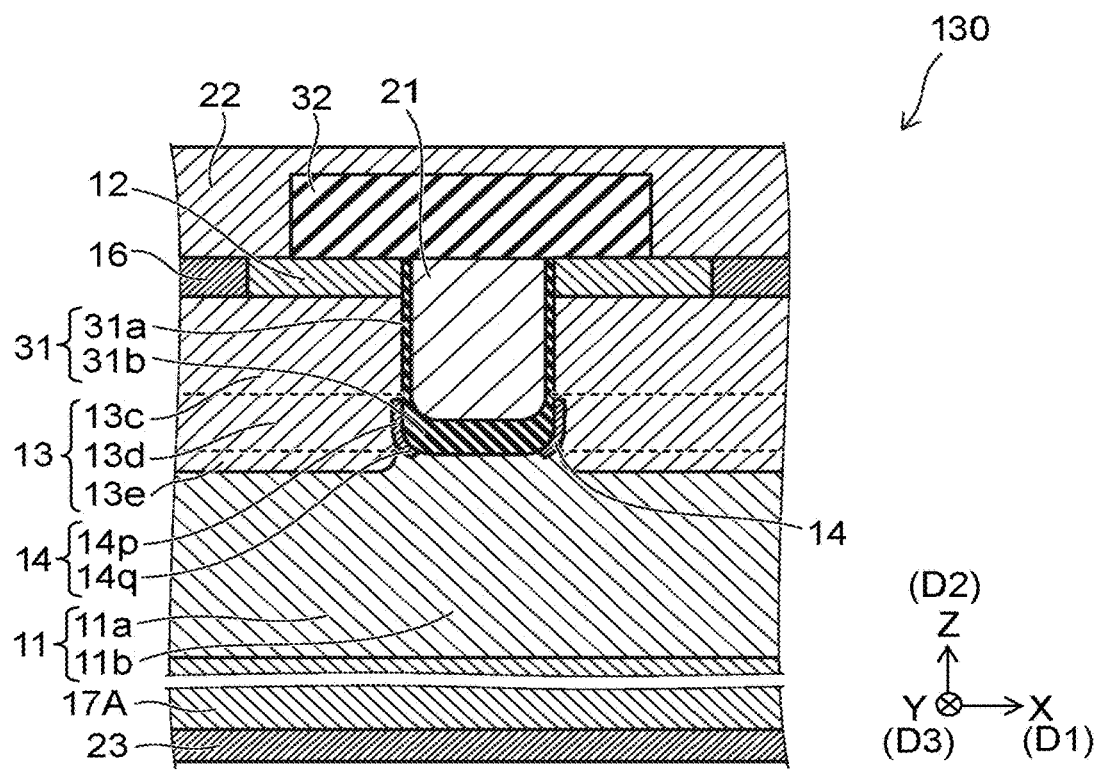
FIG. 12 is a schematic cross-sectional view illustrating a semiconductor device according to a third embodiment.

FIG. 12 is a schematic cross-sectional view illustrating a semiconductor device according to a third embodiment.

As shown in FIG. 12, the semiconductor device 130 according to the embodiment includes a seventh semiconductor region 17A in addition to the first to fourth semiconductor regions 11 to 14, the first electrode 21, and the first insulating film 31. Otherwise, the semiconductor device 130 is similar to the semiconductor device 110. For example, the semiconductor device 130 may further include the sixth semiconductor region 16, the second electrode 22, the third electrode 23, and the second insulating film 32. The seventh semiconductor region 17A of the semiconductor device 130 is of the second conductivity type. Otherwise, the semiconductor device 130 is similar to the semiconductor device 110.

Figure 13:
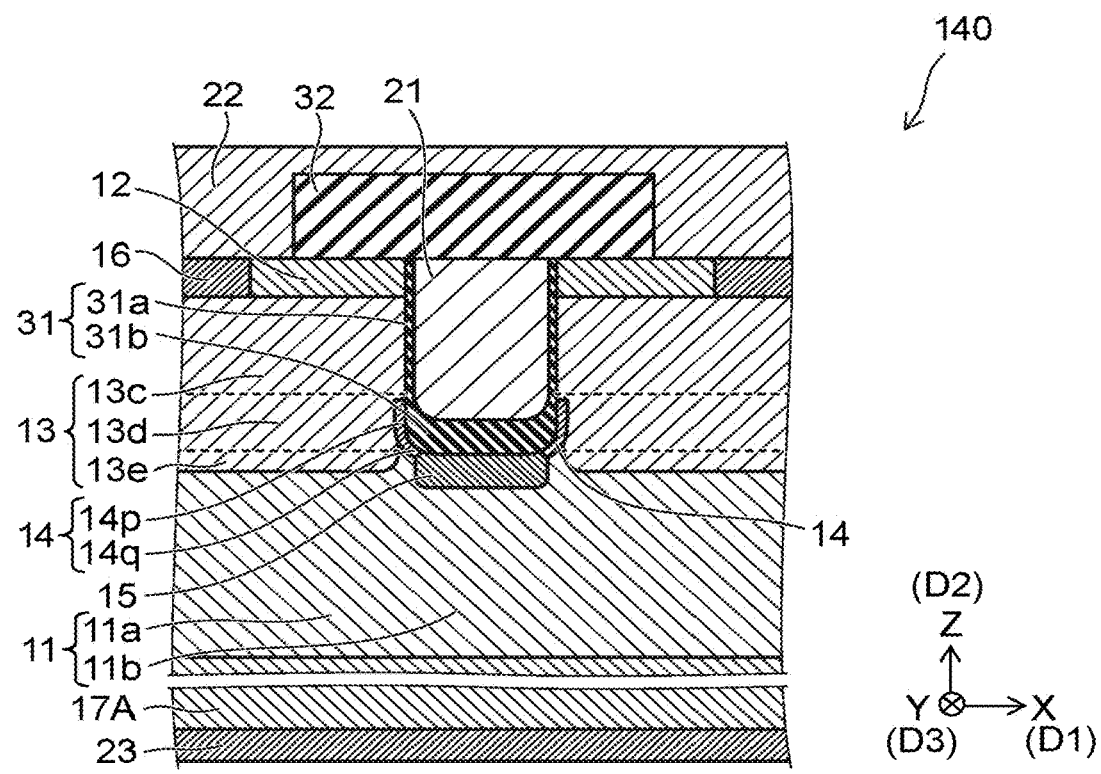
FIG. 13 is a schematic cross-sectional view illustrating another semiconductor device according to the third embodiment.

FIG. 13 is a schematic cross-sectional view illustrating another semiconductor device according to the third embodiment.

As shown in FIG. 13, the semiconductor device 140 according to the embodiment further includes the fifth semiconductor region 15 in addition to the first to fourth semiconductor regions 11 to 14, the first electrode 21, and the first insulating film 31. Otherwise, the semiconductor device 140 is similar to the semiconductor device 130. For example, the semiconductor device 140 may further include the sixth semiconductor region 16, the seventh semiconductor region 17A, the second electrode 22, the third electrode 23, and the second insulating film 32.

In the semiconductor devices 130 and 140, the seventh semiconductor region 17A is, for example, a substrate of the second conductivity type. The seventh semiconductor region 17A is provided between the third electrode 23 and the first semiconductor region 11.

The semiconductor devices 130 and 140 are, for example, IGBTs (Insulated Gate Bipolar Transistors). In the semiconductor devices 130 and 140 as well, a semiconductor device can be provided in which the on-resistance can be reduced.

For example, the semiconductor device 130 can be manufactured by appropriately modifying the manufacturing method described in reference to FIG. 9A to FIG. 9D. For example, the semiconductor device 140 can be manufactured by appropriately modifying the manufacturing method described in reference to FIG. 11A to FIG. 11E.

According to the embodiments, a semiconductor device and a method for manufacturing the semiconductor device can be provided in which the on-resistance can be reduced.

In the embodiments, the information that relates to the impurity concentration is obtained by, for example, SIMS (Secondary Ion Mass Spectrometry), etc. In the description recited above, for example, the information that relates to the carrier concentration may be obtained by SCM (Scanning Capacitance Microscopy), etc.; and the impurity concentration may be obtained based on the carrier concentration.

In this specification, the "state of being electrically connected" includes the state in which multiple conductive bodies are physically in contact, and a current flows between the multiple conductive bodies. The "state of being electrically connected" includes the state in which another conductive body is inserted between multiple conductive bodies, and a current flows between the multiple conductive bodies.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as semiconductor regions, electrodes, insulating films, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices, and methods for manufacturing the same practicable by an appropriate design modification by one skilled in the art based on the semiconductor devices, and the methods for manufacturing the same described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

The invention claimed is:

1. A semiconductor device, comprising:
a first semiconductor region including a first partial region and a second partial region and being of a first conductivity type;
a second semiconductor region separated from the first partial region in a second direction crossing a first direction, the second semiconductor region being of the first conductivity type, the first direction being from the first partial region toward the second partial region;
a third semiconductor region provided between the first partial region and the second semiconductor region, the third semiconductor region being of a second conductivity type and comprising a third partial region and a fourth partial region, the fourth partial region being positioned between the first partial region and the third partial region;
a first electrode separated from the second partial region in the second direction and separated from the second semiconductor region and the third semiconductor region in the first direction;
a first insulating film comprising a first insulating region and a second insulating region, the first insulating region being provided between the second semiconductor region and the first electrode in the first direction and between the third semiconductor region and the first electrode in the first direction, a portion of the first insulating region contacting the third partial region, the second insulating region being provided between the second partial region and the first electrode in the second direction; and
a fourth semiconductor region comprising a first portion and being of the first conductivity type, the first portion being provided between the fourth partial region and at least a portion of the first insulating film in the first direction,
wherein
an impurity concentration of the second conductivity type in the third partial region is higher than an impurity concentration of the second conductivity type in the fourth partial region,
the third semiconductor region further comprises a fifth partial region provided between the fourth partial region and the first partial region in the second direction, and
the impurity concentration of the second conductivity type in the fourth partial region is higher than an impurity concentration of the second conductivity type in the fifth partial region.

2. The device according to claim 1, wherein the fifth partial region does not overlap the second insulating region in the first direction.

3. The device according to claim 1, wherein a length along the first direction of the first insulating region is shorter than a length along the second direction of the second insulating region.

4. The device according to claim 1, wherein a thickness along the first direction of the first portion is not less than 0.15 times and not more than 0.75 times a length along the first direction of the first insulating region.

5. The device according to claim 1, wherein a thickness along the first direction of the first portion is not less than 0.015 μm and not more than 0.45 μm.

6. The device according to claim 1, wherein at least a portion of the first portion is positioned between the second insulating region and the fourth partial region in the first direction.

7. The device according to claim 1, wherein a portion of the first portion is positioned between the first insulating region and the fourth partial region in the first direction.

8. The device according to claim 1, wherein a portion of the first electrode in the first direction overlaps a portion of the fourth semiconductor region.

9. The device according to claim 1, wherein
the fourth semiconductor region further comprises a second portion, and
the second portion overlaps the first insulating region in the second direction.

10. The device according to claim 9, wherein the second portion overlaps a portion of the first electrode in the second direction.

11. The device according to claim 1, wherein a first impurity concentration of the first conductivity type in the fourth semiconductor region is higher than a second impurity concentration of the first conductivity type in the first partial region.

12. The device according to claim 11, wherein a first difference between the first impurity concentration and a third impurity concentration of the second conductivity type in the fourth semiconductor region is larger than a second difference between the second impurity concentration and a fourth impurity concentration of the second conductivity type in the first partial region.

13. The device according to claim 11, wherein the first impurity concentration is not less than $1 \times 10^{17}/cm^3$ and not more than $5 \times 10^{18}/cm^3$.

14. The device according to claim 1, wherein a direction from a part of the fourth semiconductor region toward the third partial region is along the second direction.

15. The device according to claim 1, wherein a direction from the fifth partial region towards a part of the first semiconductor region aligns with the first direction.

16. The device according to claim 1, wherein a lower end of the third semiconductor region is positioned lower than a lower end of the first insulating film.

17. A semiconductor device, comprising:
a first semiconductor region comprising a first partial region and a second partial region and being of a first conductivity type;
a second semiconductor region separated from the first partial region in a second direction crossing a first direction, the second semiconductor region being of the first conductivity type, the first direction being from the first partial region toward the second partial region;
a third semiconductor region provided between the first partial region and the second semiconductor region, the third semiconductor region being of a second conductivity type and comprising a third partial region and a fourth partial region, the fourth partial region being positioned between the first partial region and the third partial region;
a first electrode separated from the second partial region in the second direction and separated from the second semiconductor region and the third semiconductor region in the first direction;
a first insulating film comprising a first insulating region and a second insulating region, the first insulating region being provided between the second semiconductor region and the first electrode in the first direction and between the third semiconductor region and the first electrode in the first direction, a portion of the first insulating region contacting the third partial region, the second insulating region being provided between the second partial region and the first electrode in the second direction; and
a fourth semiconductor region comprising a first portion and being of the first conductivity type, the first portion being provided between the fourth partial region and at least a portion of the first insulating film in the first direction,
wherein
the first to fourth semiconductor regions comprise silicon carbide, and
the fourth semiconductor region comprises a Group III element and a Group V element.

18. A semiconductor device, comprising:
a first semiconductor region comprising a first partial region and a second partial region and being of a first conductivity type;
a second semiconductor region separated from the first partial region in a second direction crossing a first direction, the second semiconductor region being of the first conductivity type, the first direction being from the first partial region toward the second partial region;
a third semiconductor region provided between the first partial region and the second semiconductor region, the third semiconductor region being of a second conductivity type and comprising a third partial region and a fourth partial region, the fourth partial region being positioned between the first partial region and the third partial region;
a first electrode separated from the second partial region in the second direction and separated from the second semiconductor region and the third semiconductor region in the first direction;
a first insulating film comprising a first insulating region and a second insulating region, the first insulating region being provided between the second semiconductor region and the first electrode in the first direction and between the third semiconductor region and the first electrode in the first direction, a portion of the first insulating region contacting the third partial region, the second insulating region being provided between the second partial region and the first electrode in the second direction;
a fourth semiconductor region comprising a first portion and being of the first conductivity type, the first portion being provided between the fourth partial region and at least a portion of the first insulating film in the first direction; and
a fifth semiconductor region provided between the second partial region and the first insulating region, the fifth semiconductor region being of the first conductivity type,
an impurity concentration of the first conductivity type in the fifth semiconductor region being higher than an impurity concentration of the first conductivity type in the second partial region,
wherein
the third semiconductor region further comprises a fifth partial region provided between the fourth partial region and the first partial region in the second direction, and
the fifth partial region overlaps the fifth semiconductor region in the first direction.

* * * * *